United States Patent [19]
Cook et al.

[11] 4,384,610
[45] May 24, 1983

[54] SIMPLE THERMAL JOINT

[75] Inventors: Ronald S. Cook; Kenneth H. Token, both of St. Charles, Mo.

[73] Assignee: McDonnell Douglas Corporation, Long Beach, Calif.

[21] Appl. No.: 312,418

[22] Filed: Oct. 19, 1981

[51] Int. Cl.³ .................... F28F 13/14; H01L 23/40
[52] U.S. Cl. .................................. 165/80 A; 165/185; 174/16 HS; 361/386
[58] Field of Search .............. 165/79, 133, 80 R, 80 A, 165/80 B, 80 C, 80 D, 80 E, 185 R, 185 A; 361/386; 174/16 HS

[56] References Cited

U.S. PATENT DOCUMENTS

| | | | |
|---|---|---|---|
| 3,965,973 | 6/1976 | Thettu et al. | 165/185 X |
| 4,109,706 | 8/1978 | Moone | 165/185 X |
| 4,151,547 | 4/1979 | Rhoades et al. | 165/185 X |
| 4,233,645 | 11/1980 | Balderes et al. | 361/386 X |

OTHER PUBLICATIONS

Construction of a Liquid Metal Filled Module, Aihold et al, IBM Technical Disclosure Bulletin, vol. 22, No. 2, Jul. 1979, pp. 602–605.

*Primary Examiner*—Sheldon J. Richter
*Attorney, Agent, or Firm*—George W. Finch; John P. Scholl; Donald L. Royer

[57] ABSTRACT

A thermally conductive mechanical joint is provided between two object surfaces across which it is desired to conduct heat. The joint includes metallic material of a predetermined melting point below the normal operating temperature of the joint. The metallic material is bounded by a mask forming cells of sufficiently small dimensions that the melted metallic material can withstand the anticipated loading normal to the joint and at right angles to the heat transfer direction. The metallic cells can be provided on opposite sides of a thin heat conductive layer provided between the surfaces of the joint or they can be provided directly on one of the surfaces of the joint. By proper choice of materials, the metallic material will remain in the cells even though the thermal joint is made and broken on multiple occasions.

22 Claims, 15 Drawing Figures

4,384,610

SIMPLE THERMAL JOINT

BACKGROUND OF THE INVENTION

Whenever it is desired to transfer or dissipate heat from one object to another by conduction, the critical element in the exchange is the joint between the two objects. The typical method of enhancing the heat exchange is to machine the interface surfaces of the two objects to high tolerances and hold them tightly together so that a relatively high percentage of the facing surface areas are in contact. Not only is this method expensive, but the thermal efficiency of the joint is a function of the smoothness of the surface finish and the amount of pressure applied thereacross. Even though the surface irregularities are microscopic and the pressure employed between the contacting surfaces large, only a relatively low thermal efficiency results. Known materials to enhance exchange across the joint include thermal greases which can reduce the thermal resistance across the joint by a factor of 2 or by making a metallic bond between the surfaces as by brazing. The thermal greases degrade with time as solvents evaporate with repeated opening and closing of the mechanical joint and have an affinity for contaminates such as dirt and dust so that a relatively inefficient heat transfer still results. Metallic bonds, on the other hand, can provide a thermal joint which has very little thermal resistance but which is very difficult to make and break in service. In some instances, as reported in the Journal of Heat Transfer, August 1963, Transactions of the ASME pp. 273-278 in an article entitled, "An Expermental Investigation of Free-Convection Heat Transfer From Rectangular-Fin Arrays" by K. E. Starner and H. N. M$^c$Manus, Jr., liquid metal has been used in expermental situations to conduct heat from a heater to heat dissipating fins whose effectiveness is being investigated.

Airborne electronics for avionic systems produce very large heat loads and require sophisticated environmental control systems for cooling. In current experimental cooling systems solid state avionic components are attached to printed circuit boards which are provided with conductor strips. The strips may be small heat pipes which carry the heat from the components to a common sidewall which also may be a series of heat pipes which in turn are connected to a liquid cooled heat exchanger or cold wall. The connections between the solid state avionic components, the heat pipes, and the cold wall are all thermal joints which must be mechanically breakable to allow maintenance yet the prior art breakable thermal joints impede the heat transfer process.

In any heat exchange process, it is desirable to keep the temperature difference across a thermal joint between the component cooled and the coolant to a minimum for maximum efficiency. A reduced temperature difference possible because of reduced thermal resistance across the joint either allows the cooled components to operate at a reduced temperature or allows coolant to be supplied at a higher temperature. Therefore, the thermal interface resistance between the surfaces of each of the mechanical joints in a cooling system is critical to the overall heat exchange process of the system.

Whatever joint is supplied, it must be one that is capable of being removed frequently for servicing and repair or replacement. Also, the environmental conditions to which avionic components are exposed can be extremely harsh especially in terms of vibratory and inertial loading. Therefore, there has been a need for a relatively economic thermal joint with low thermal resistance which can be mechanically disconnected and reconnected on numerous occasions without degradation for use in vibratory or high G environments.

BRIEF DESCRIPTION OF THE PRESENT INVENTION

In the present invention at least one metallic layer is provided in contact with the two surfaces between which it is desired to establish a thermal joint. The metallic layers may be positioned on one side of the joint or may be placed on both sides of a carrier sheet positioned within the joint. When a proper metallic material is chosen which melts below the desired heat transfer temperature, a highly efficient thermal joint can be established since the melted material fills in the voids otherwise present in the joint so that the joint thermally acts like a metal to metal bond.

To prevent the loss of the melted metallic material during vibratory or high G conditions, the metallic material is retained within cells formed on the carrier sheet or the one side of the joint such as by utilizing photoresist maskant. The cells and the gaps therebetween formed by the maskant are sized so that the possible head due to the G loading is less than that required to bridge the gap between cells formed by the maskant. The surface on which the metallic material is to remain when the joint is broken is chosen for its affinity for the metallic material such as plating it with copper, whereas the opposite surface can be material such as bare aluminum which is very difficult to wet with most low melting point metals. In some instances, when the copper is applied over aluminum after the maskant, the maskant can be removed and the exposed aluminum remaining and its resistance to wetting prevents bridging by the melted material.

Therefore, it is an object of the present invention to provide an improved mechanically breakable thermal joint for use where high efficiency is required in an adverse environmental condition.

Another object is to provide a mechanical thermal joint which is economically manufacturable and can be incorporated in many different design situations.

Another object is to provide a mechanical thermal joint which can be retrofitted into existing systems to improve the thermal conductivity thereof.

Another object is to provide a mechanically breakable and rejoinable thermal joint which is not subject to contamination when in the open condition.

Another object is to provide a thermal joint for avionic systems of high performance aircraft.

Another object is to provide a thermal joint which can be applied to existing electronic components.

These and other objects and advantages of the present invention will become apparent to those skilled in the art after considering the following detailed specification in conjunction with the accompanying drawings, wherein:

DETAILED DESCRIPTION OF THE SHOWN EMBODIMENTS

Figure 1:
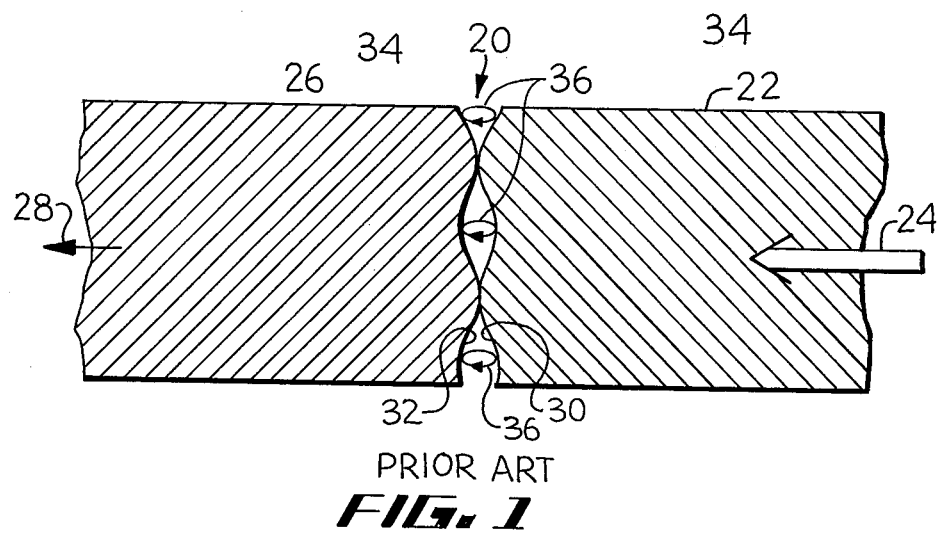
FIG. 1 is an enlarged, exaggerated, cross-sectional view of a typical mechanical thermal joint.

Referring to the drawings more particularly by reference numbers, number 20 in FIG. 1 refers to a prior art mechanical thermal joint. The joint 20 includes a hot member 22 into which heat 24 is flowing and cooling member 26 out of which heat 28 is flowing. The roughness of the joint 20 is greatly magnified but is typical of mechanical joints in that even though the two members 22 and 26 may be forcefully held together at their contacting surfaces 30 and 32, the actual contact areas 34 therebetween represent only a small percentage of the total area of the surfaces 30 and 32. Therefore, the primary heat transfer mechanism is by microscopic convection of the gases 36 trapped in the cavities in the joint 20. the resistance of thermal joints to heat transfer can be reduced by filling the voids with a high thermal conductivity material. Such materials in current use include thermal greases and metal foils. Thermal greases are very inconvenient to use in applications which require repeated opening and closing of the joint, and are also subject to contamination and degraded performance. Metals, as a class of materials, exhibit high thermal conductivity. However, metal foils previously used are inconvenient to use and rely on interface pressure to make and maintain good thermal contact. Metals in the liquid state exhibit high thermal conductivity and have the added advantage of being able to fill the voids in mechanical joints without relying on interstitial pressure. Eutectic metal alloys, in particular, can be formulated with melting points spanning a broad temperature range by varying their composition. This feature makes them ideally suited as thermal conductance enhancement materials. For simplicity, the following description of the present invention is based on the use of a eutectic alloy as the enhancement material. However, the success of the present invention is not limited to the use of eutectic alloys. For example, pure metals or noneutectic alloys could be used in the right temperature conditions.

Figure 2:
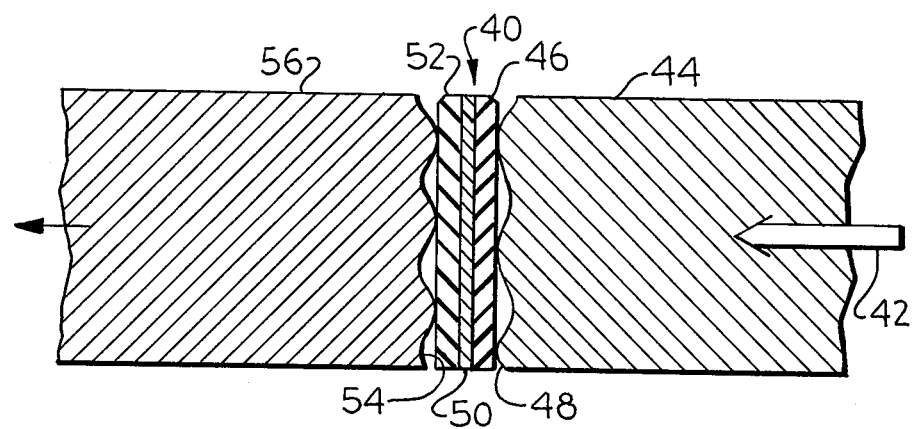
FIG. 2 is an enlarged cross-sectional view of a joint constructed according to the present invention prior to the time it has reached its normal operating temperature.
Figure 3:
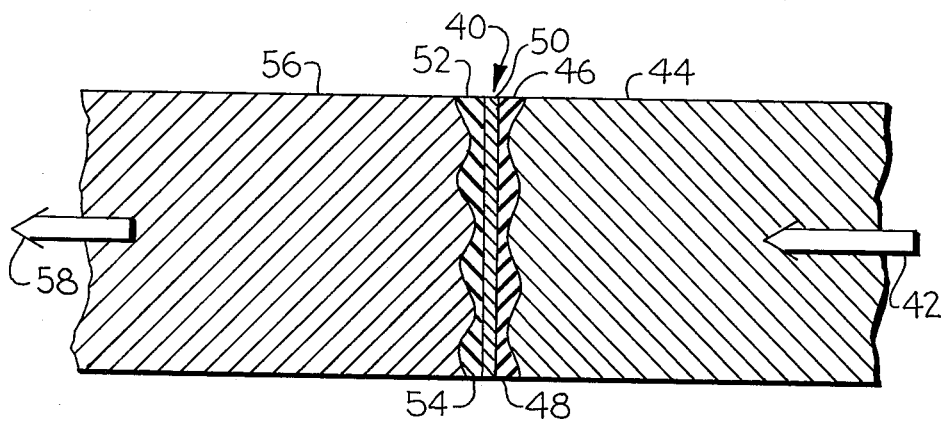
FIG. 3 is a view of the joint of FIG. 2 once it has reached its normal operating temperature.

A thermal joint 40 constructed according to the present invention is shown in FIG. 2. In joint 40 heat 42 passing along the hot member 44 warms a metallic layer 46, usually a low melting point eutectic, in contact with its heat transference surface 48 until the metallic layer 46 melts. Melted metallic material forms an extremely low thermal barrier at the surface 48. The heat 42 transfers through a carrier sheet 50, normally constructed from copper, silver or other high conductive material of sufficient physical strength which easily is wetted by the layer 46, melting a second layer of metallic material 52. The melted layer 52 forms a low resistance thermal path between the carrier sheet 50 and the heat entry surface 54 on the cold member 56 as shown in FIG. 3 so that the heat 58 passing into the cold member 56 results in a negligible temperature difference across the joint 40. When the joint 40 is to be broken, the heat generator is turned off and the joint 40 allowed to cool. When the metallic layer 46 solidifies, it remains on the carrier sheet 50 and releases from the surfaces 48 and 54 allowing the joint 40 to be broken.

Figure 4:
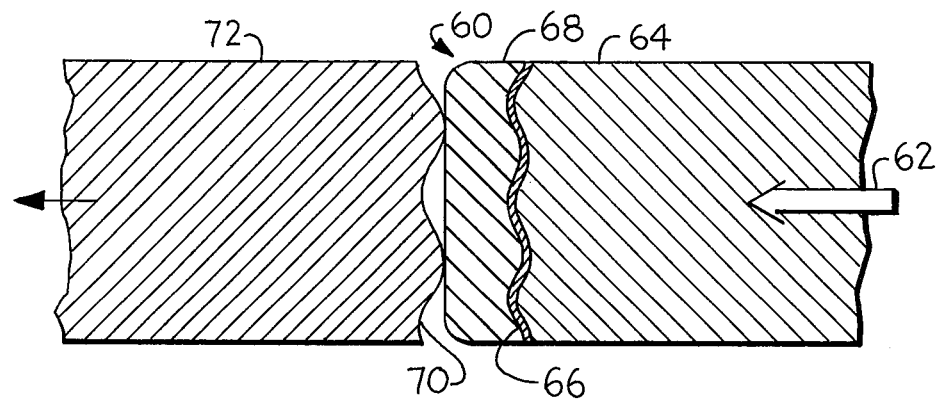
FIG. 4 is an enlarged cross-sectional view of a modified form of the present invention prior to the time it has reached its normal operating temperature.
Figure 5:
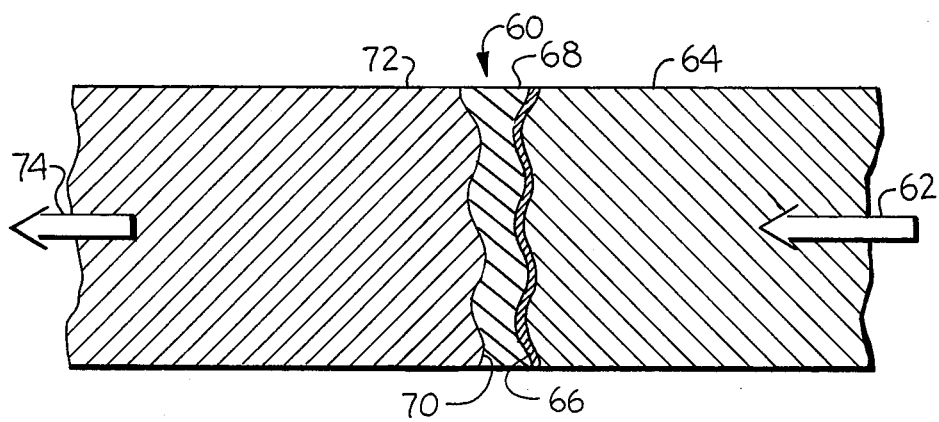
FIG. 5 is a cross-sectional view of the joint of FIG. 4 once it has reached its operating temperature.

A modified joint 60, constructed according to the present invention, is shown in FIGS. 4 and 5. In that joint, heat 62 passes into the hot member 64 whose heat conducting surface 66 has been coated with the material such as copper which has high thermal conductivity and is easily wetted by a metallic material 68 such as a eutectic alloy. When the heat 62 raises the temperature of the eutectic layer 68 toward its design operating temperature, the eutectic layer 68 melts forming a low resistance contact with the heat input surface 70 of the cold member 72 again resulting in a heat output 74 and little measurable temperature differential across the joint 60. When the joint 60 is cooled, the layer 68 solidifies and adheres to the surface 66 releasing surface 70 for breaking the joint 60.

Figure 6:
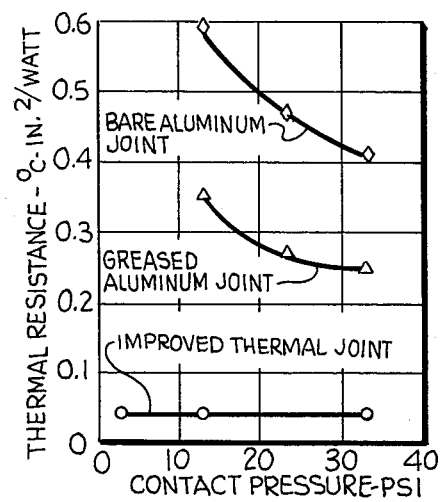
FIG. 6 is a graph of joint resistance versus joint contact pressure for joints of bare aluminum, greased aluminum and those of the present invention.

The effect of the present invention with respect to prior art joints is shown in FIG. 6. The joint thermal resistance of the present invention is practically immeasurable with respect to the thermal resistance of a bare aluminum joint or a greased aluminum joint. It should be noted that contact pressure is not a primary design consideration when using the present invention, whereas in bare aluminum joints and greased aluminum joints increasing pressure is required for greater efficiency. The requirement for high joint contact pressure apparent from the graph for aluminum joints presents a difficult and expensive design problem eliminated through use of the present invention.

Figure 7:
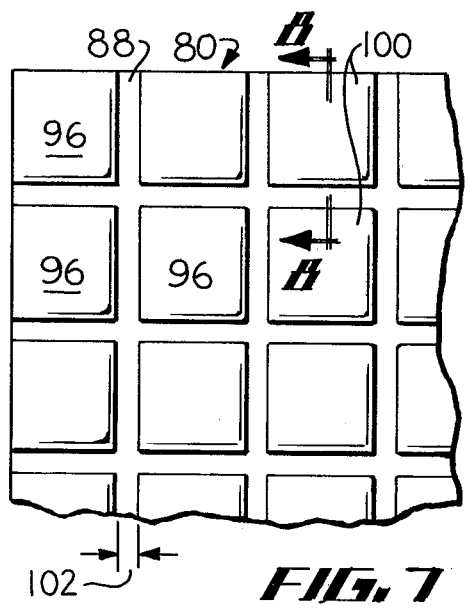
FIG. 7 is an enlarged front view of the present invention showing a typical cell configuration.
Figure 8:
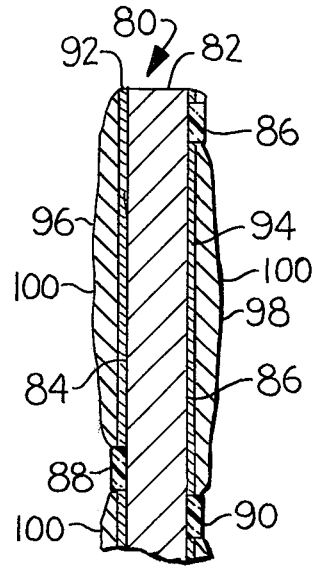
FIG. 8 is an enlarged cross-sectional view taken on line 8—8 of FIG. 7.
Figure 9:
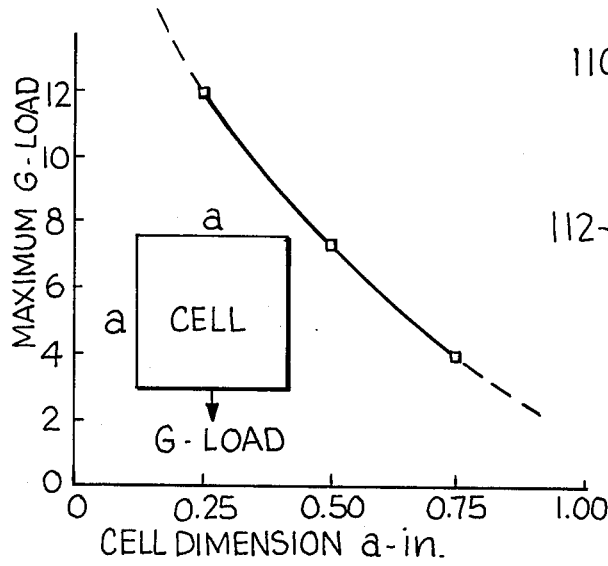
FIG. 9 is a graph of maximum G-load versus cell dimension for cells shaped as in FIGS. 7 and 8.

FIGS. 7 and 8 show a heat conductor element 80 used to provide a preferred embodiment of the present invention. The element 80 includes a thin sheet 82 of thermally conductive carrier material, such as aluminum, both sides thereof 84 and 86 having patterns of maskant 88 and 90 applied thereto. Thereafter, the surfaces 84 and 86 are coated in the unmasked areas with an easily wetted, high thermal conductivity material such as copper so that layers 92 and 94 of copper are present within the outlines formed by the maskant patterns 88 and 90. The copper layers 92 and 94 are then coated with layers of eutectic material 96 and 98 which remains within the maskant patterns 88 and 90 because the maskant is inherently very difficult to wet. The result is cells 100 of eutectic having predetermined dimensions. The dimensions of the cells 100 are determinative upon the amount of G-loading that can be withstood by the thermal joint 80 in use with its eutectic 96 and 98 melted in contact between hot and cold members, as shown in FIGS. 2 and 3. A graph of experimental data of G-loading versus square coupon dimension is shown in FIG. 9 showing that as the G-loading increases the size of the cells 100 must be decreased with a constant masked pattern dimension 102.

To construct the device of FIGS. 7 and 8 in accordance with FIGS. 4 and 5, the aluminum layer 82 should be merely considered as the member 64. The carrier member 82 may also be constructed from a sheet of copper with a maskant applied over the copper to form the cells 100. The advantage and simplicity and slight additional heat conductivity of copper is usually overcome however by the weight disadvantage of copper when compared to aluminum or other such materials when the joint 80 is to be used in avionic applications.

Figure 10:
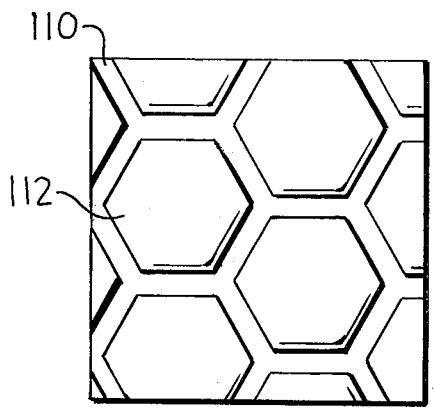
FIG. 10 is an enlarged front view of cells optimized for omni-directional loading.
Figure 11:
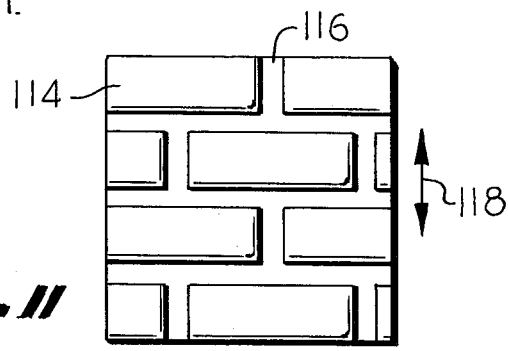
FIG. 11 is a front view of cells optimized for more uni-directional loading.

Although the cells 100 are shown as square in FIG. 7, the limiting size factor on such is the head which can be developed in the eutectic due to G-loading. It is also desirable that the masked area be as small as possible because relatively very little heat transfer can occur through the maskant. The cells 100 being square are disadvantageous if the maximum load is to be applied diagonally thereacross since a greater head can be generated in that direction. Therefore, patterns such as the honeycomb maskant pattern 110, shown in FIG. 10, having eutectic cells 112 shaped to be less affected by G-loading in a particular direction can provide a joint for more omnidirectional applications, whereas the rectangular cells 114 formed by the maskant pattern 116 in FIG. 11 are more ideally suited for G-loads in the directions indicated by the arrow 118. The thickness dimension 102 of the maskant pattern is important since it controls the head required for the eutectic to bridge between cells and be lost in service with two competing design considerations. The broader the dimension 102 the higher the head that can be accommodated. However, the broader the dimension 102 the greater surface area which is not converted by eutectic and therefore is lost for heat conduction purposes.

Figure 12:
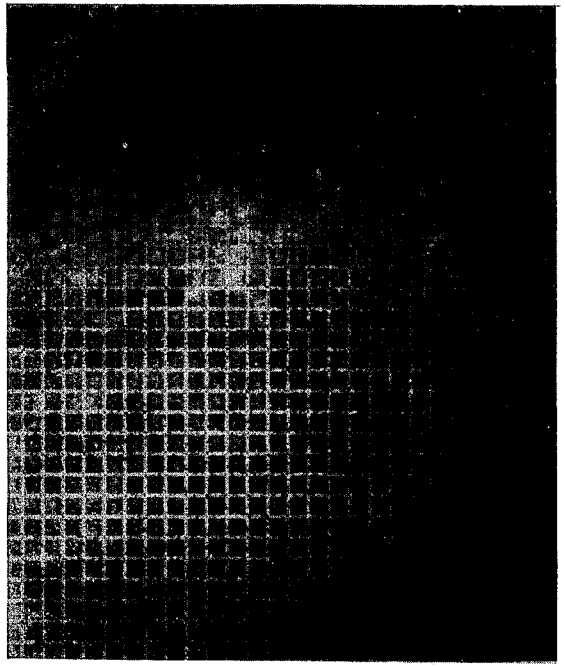
FIG. 12 is a photograph of an aluminum sheet having copper plated thereover through a masked pattern.
Figure 13:
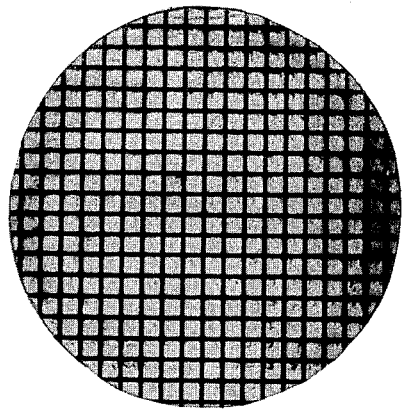
FIG. 13 is a photograph of a test sample of the present invention with 117° F. melting point eutectic applied to the copper portions of FIG. 12.
Figure 14:
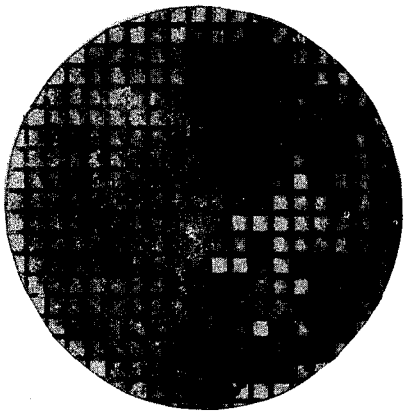
FIG. 14 is a photograph of a sample similar to that of FIG. 13 wherein the maskant has been left in place and the sample subjected to G-loading while it is transferring heat therethrough indicating very little eutectic movement.
Figure 15:
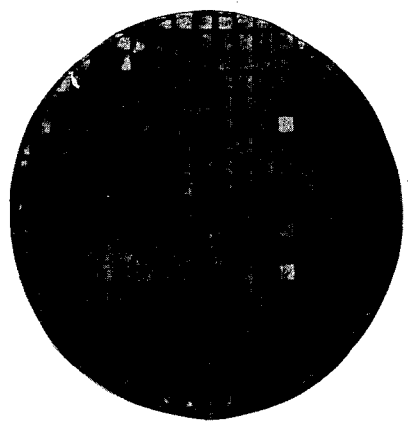
FIG. 15 is a test sample similar to FIG. 14 wherein the maskant was removed prior to G-load testing.

FIGS. 12 through 15 are photographs of test specimens. FIG. 12 shows an aluminum plate having a square grid mask applied thereto over which copper plating has been applied to form square 0.125×0.125 inch copper cells separated by 0.030 inches. FIG. 13 shows the sample of FIG. 12 after eutectic has been applied to the copper areas thereof. FIGS. 14 and 15 show samples like FIG. 13 after subjection to G-loading which was applied downward in the orientation of the drawing. In FIG. 14 the maskant was left on the aluminum and in FIG. 15, the maskant was removed. As can be seen although there was some eutectic movement due an excess of eutectic on the smaple but the amount required for a successful mechanical thermal joint remained in place even though it was subjected to relatively high G-loading.

Therefore there has been shown and described novel simple thermal joints which fulfill all of the objects and advantages sought therefore. Many changes, alterations, modifications and other uses and applications of the subject thermal joints will become apparent to those skilled in the art after considering this specification together with the accompanying drawings. All such changes, alterations and modifications which do not depart from the spirit and scope of the invention are deemed to be covered by the invention which is limited only by the claims which follow.

What is claimed is:

1. A mechanically breakable thermal joint for operation above a predetermined temperature including:
   a first member having a heat transfer surface thereon;
   a second member having a heat transfer surface thereon;
   a thermally conductive layer positioned between said heat transfer surfaces of said first and second members; and
   a first layer of metallic material positioned between said thermally conductive layer and said second member heat transfer surface and connected to said thermally conductive layer, said first layer of metallic material being liquid at the predetermined temperature of operation, said second member being constructed from metallic material which is not strongly wetted by said melted first layer of metallic material and said thermally conductive layer being constructed from metallic material which is strongly wetted by said melted first layer of metallic material whereby upon cooling of said joint below said predetermined temperature, said first layer of metallic material remains attached to said thermally conductive layer.

2. The mechanically breakable thermal joint defined in claim 1 wherein said thermally conductive layer is bonded to said heat transfer surface of said first member.

3. The mechanically breakable thermal joint defined in claim 2 wherein said thermally conductive layer is comprised of a plurality of separated cells having predetermined dimensions and shape.

4. The mechanically breakable thermal joint defined in claim 3 wherein said first layer of metallic material is positioned on said plurality of separated cells as separated cells, said predetermined dimensions and shape of said cells being chosen so that said melted first layer of metallic material on each cell remains on each cell when subjected to a predetermined G-loading.

5. The mechanically breakable thermal joint defined in claim 4 further including:
   a first pattern separating said cells of said layer of conductive material, said first pattern having a surface material which is not strongly wetted by said melted metallic material, wherein said cells have a predetermined heat transfer surface area and said first pattern has a predetermined surface area, said predetermined heat transfer surface area being much greater than said first pattern predetermined surface area.

6. The mechanically breakable thermal joint defined in claim 4 further including:
   a maskant pattern separating said cells.

7. The mechanically breakable thermal joint defined in claim 4 further including:
   a pattern separating said cells having a surface material which is not strongly wetted by said melted first layer of metallic material.

8. The mechanically breakable thermal joint defined in claim 4 wherein said predetermined dimensions of said cells are inversely related to the predetermined G-loading.

9. The mechanically breakable thermal joint defined in claim 1 further including:
a second layer of metallic material positioned between said thermally conductive layer and said first member heat transfer surface and connected to said thermally conductive layer, said second layer of metallic material being liquid at the predetermined temperature of operation, said first member being constructed from metallic material which is not strongly wetted by said melted second layer of metallic material and said thermally conductive layer being constructed from metallic material which is strongly wetted by said melted second layer of metallic material whereby upon cooling of said joint below said predetermined temperature, said second layer of metallic material remains attached to said thermally conductive layer.

10. The mechanically breakable thermal joint defined in claim 9 further including:
a thermally conductive core layer positioned between said thermally conductive layer and said first member heat transfer surface, said thermally conductive core layer being attached to said thermally conductive layer;
a second thermally conductive layer positioned between said thermally conductive core layer and said first member heat transfer surface, said second thermally conductive layer being attached to said thermally conductive core layer; and
a second layer of metallic material positioned between said second thermally conductive layer and said first member heat transfer surface and connected to said second thermally conductive layer, said second layer of metallic material being liquid at the predetermined temperature of operation, said first member being constructed from metallic material which is not strongly wetted by said melted second layer of metallic material and said thermally conductive layer being constructed from metallic material which is strongly wetted by said melted second layer of metallic material whereby upon cooling of said joint below said predetermined temperature, said second layer of metallic material remains attached to said thermally conductive layer.

11. The mechanically breakable thermal joint defined in claim 9 wherein said thermally conductive layer includes:
an aluminimum core having as its opposite sides first and second thermally conductive layer surfaces, said first and second thermally conductive layer surfaces being constructed from copper and formed into separated cells.

12. The mechanically breakable thermal joint defined in claim 11 wherein said first and second thermally conductive layer surfaces are formed into separated cells.

13. The mechanically breakable thermal joint defined in claim 9 wherein said thermally conductive layer includes:
first and second thermally conductive layer surfaces comprised of a plurality of separated cells having predetermined dimensions and shape.

14. The mechanically breakable thermal joint defined in claim 13 wherein said first layer of metallic material is positioned on said plurality of separated cells of said second layer surface and said second layer of metallic material being positioned on said plurality of separated cells of said first layer surface, said predetermined dimensions and shape of said cells being chosen so that said melted first and second layers of metallic material remains on said cells when said joint is subjected to a predetermined G-loading.

15. The mechanically breakable thermal joint defined in claim 14 further including:
first and second maskant patterns separating said cells of each first and second thermally conductive layer surfaces respectively.

16. The mechanically breakable thermal joint defined in claim 14 further including:
first and second patterns separating said cells of each first and second thermally conductive layer surfaces respectively, said first and second patterns each having a surface material which is not strongly wetted by said melted metallic material.

17. The mechanically breakable thermal joint defined in claim 14 wherein said predetermined dimensions of said cells are inversely related to the predetermined G-loading.

18. The mechanically breakable thermal joint defined in claim 14 wherein said cells have a total predetermined heat transfer surface area which is only slightly less than the total surface area of said first and second thermally conductive surfaces.

19. The mechanically breakable thermal joint defined in claim 1 wherein said first member has heat transferred out thereof and said second member has heat transferred thereinto.

20. The mechanically breakable thermal joint defined in claim 1 wherein said first layer of metallic material is essentially pure metal.

21. The mechanically breakable thermal joint defined in claim 1 wherein said first layer of metallic material is a metal alloy.

22. The mechanically breakable thermal joint defined in claim 1 wherein said first layer of metallic material is an eutectic metal alloy.

* * * * *